(12) United States Patent
Huang et al.

(10) Patent No.: US 12,406,112 B2
(45) Date of Patent: Sep. 2, 2025

(54) THREE-DIMENSIONAL SIMULATION AND PREDICTION METHOD FOR ROCK COLLAPSE MOVEMENT PROCESS CONSIDERING DYNAMIC FRAGMENTATION EFFECT

(71) Applicant: CHENGDU UNIVERSITY OF TECHNOLOGY, Chengdu (CN)

(72) Inventors: Jian Huang, Chengdu (CN); Jingqing Yuan, Chengdu (CN)

(73) Assignee: CHENGDU UNIVERSITY OF TECHNOLOGY, Chengdu (CN)

( * ) Notice: Subject to any disclaimer, the term of this patent is extended or adjusted under 35 U.S.C. 154(b) by 0 days.

(21) Appl. No.: 18/958,946

(22) Filed: Nov. 25, 2024

(65) Prior Publication Data
US 2025/0173480 A1      May 29, 2025

(30) Foreign Application Priority Data
Nov. 23, 2023   (CN) .......................... 202311572039.6

(51) Int. Cl.
*G06F 30/20*           (2020.01)

(52) U.S. Cl.
CPC .................................. *G06F 30/20* (2020.01)

(58) Field of Classification Search
USPC .......................................................... 703/11
See application file for complete search history.

(56) References Cited

FOREIGN PATENT DOCUMENTS

| CA | 3175851 A1 | * | 2/2023 | ............... G01V 1/50 |
|---|---|---|---|---|
| CN | 116129035 A | | 5/2023 | |
| CN | 116205035 A | | 6/2023 | |
| CN | 116306131 A | | 6/2023 | |
| CN | 116861671 A | * | 10/2023 | |

* cited by examiner

*Primary Examiner* — Mohammed Alam
(74) *Attorney, Agent, or Firm* — George D. Morgan

(57) ABSTRACT

The present invention discloses a three-dimensional simulation and prediction method for the fragmented rock movement considering a dynamic fragmentation effect during the impact process. The method includes: establishing a rock mass structure model; acquiring dynamic parameters under a real environment, including a collision position vector $\vec{p}=(P_x, P_y, P_z)$, a collision linear velocity $\vec{v}=(V_x, V_y, V_z)$, and a collision angular velocity $\vec{\omega}=(\omega_x, \omega_y, \omega_z)$; and simulating the collision, fragmentation, and movement processes of the rock mass. Based on the rock mass fragmentation model, whether the rock mass fragmentation occurs or not can be determined. Then, the trajectory of each fragmented block can be simulated using the energy distribution model and fragmented block trajectory model.

2 Claims, 2 Drawing Sheets

THREE-DIMENSIONAL SIMULATION AND PREDICTION METHOD FOR ROCK COLLAPSE MOVEMENT PROCESS CONSIDERING DYNAMIC FRAGMENTATION EFFECT

CROSS-REFERENCE TO RELATED APPLICATIONS

The application claims priority to Chinese patent application No. 2023115720396, filed on Nov. 23, 2023, the entire contents of which are incorporated herein by reference.

TECHNICAL FIELD

The present invention relates to the technical field of risk assessment and prevention for rock collapse disasters, and in particular, to a three-dimensional simulation and prediction method for a rock collapse movement process considering a dynamic fragmentation effect.

BACKGROUND

Due to the complexity of a rock mass structure and the uncertainty of joint, orientation, and strength parameters thereof, the risk assessment of rock collapse disasters is extremely difficult. Especially, there is no reasonable prediction method for disintegration and fragmentation phenomena of rock masses that occur in a rock collapse movement process.

In recent years, researches on rock collapse disasters have focused on the movement process, which is usually influenced by factors such as the properties of rock masses and topographic conditions. The forms of movement alternate between flying, sliding, rolling, crushing, etc., and the mechanical mechanisms involved in the movement process are complex. Field investigation, theoretical calculations, field tests, model experiments, and numerical simulations are commonly used research methods. Among them, numerical simulations have irreplaceable advantages compared to other methods, such as low time cost, high experimental repeatability, and easiness in variable control. Most existing models of the rock collapse movement process consider rock collapse as a complete block that will not be broken after impact. However, dynamic crushing is a common phenomenon in collapse disasters, especially for brittle rock masses with high weathering degree and high strength. The impact fragmentation process will have a significant influence on a movement trajectory of the block. Therefore, the influence of the dynamic fragmentation process on the movement trajectory of rock collapse cannot be neglected. How to accurately predict the volume, energy, and movement directions of rock blocks in the rock collapse process is an important research direction for predicting and simulating the rock collapse disasters.

SUMMARY

The present invention aims to provide a three-dimensional simulation and prediction method for a rock collapse movement process considering a dynamic fragmentation effect, so as to improve the accuracy and reliability of fine and quantitative risk estimation for rock collapse disasters.

Embodiments of the present invention provide a three-dimensional simulation and prediction method for a rock collapse movement process considering a dynamic fragmentation effect, where the method includes:

constructing a rock mass structure model;

acquiring simulation parameters based on a real environment, the simulation parameters including: a collision position vector $\vec{p}=(P_x, P_y, P_z)$, a collision linear velocity $\vec{v}=(V_x, V_y, V_z)$, and a collision angular velocity $\vec{\omega}=(\omega_x, \omega_y, \omega_z)$;

simulating collision, fragmentation, and movement processes of the rock mass structure model based on the simulation parameters to obtain a total energy before the rock mass structure model is collided using the simulation parameters;

based on the total energy and preset rock mass fragmentation conditions, determining whether the rock mass structure model is fragmented after the rock mass structure model is collided using the simulation parameters;

in a case of determining that the rock mass structure model is fragmented, determining a volume of each fragmented block, a movement trajectory of each fragmented block, and energy of each fragmented block after impact fragmentation occurs according to a fragmented block volume model, a fragmented block trajectory model, and a fragmented block energy distribution model.

Preferably, the based on the total energy and preset rock mass fragmentation conditions, determining whether the rock mass structure model is fragmented after the rock mass structure model is collided using the simulation parameters includes:

generating a random number; and determining whether the rock mass structure model is fragmented based on a comparison between the total energy and a preset rock mass fragmentation energy threshold, as well as a comparison between the random number and a preset rock block fragmentation survival rate.

Preferably, the determining a volume of each fragmented block after impact fragmentation occurs according to a fragmented block volume model includes:

acquiring a volume $V_0$ of an initial rock block and a relative cumulative quantity P of the fragmented blocks;

determining a volume V of a rock block in an accumulation area based on a preset volume control formula, where the volume control formula is $P=c*V^{-b}$, and c and b in the formula are power-law distribution parameters;

determining the volume of each fragmented block after impact fragmentation occurs according to the following formula:

$$\begin{cases} V = \left(\dfrac{c}{R_i}\right)^{\frac{1}{b}}, \\ \sum_n V_i = V_0 \end{cases}$$

where $R_i$ is a random number of a volume of random fragmented blocks generated by an ith collision, $V_i$ is a volume of fragmented blocks generated by an ith collision, and a quantity of the fragmented blocks is n.

Preferably, the determining energy of each fragmented block after impact fragmentation occurs according to a fragmented block energy distribution model includes:

determining a sum of energy of each fragmented block according to a formula $E_k^b = E_k^a + E_d + E_b$, where in the formula: $E_k^b$ is total energy before collision, $E_d$ is energy lost during collision, $E_b$ is energy dissipated by fragmentation, $E_k^a$ is the sum of the energy of each fragmented block;

determining the energy of each fragmented block according to a formula $$\frac{V_i}{V_0} = \frac{E}{E_k^b},$$

where in the formula, E is the energy of each fragmented block.

Preferably, the determining a movement trajectory of each fragmented block after impact fragmentation occurs according to a fragmented block trajectory model includes:

determining an impact point of a rock block based on simulation parameters;

establishing a cone equation based on the impact point, determining a random vector of the rock block inside a cone through a rectangular coordinate-spherical coordinate transformation method, and unitizing the random vector to determine a trajectory unit vector of the rock block after collision; and determining a movement velocity of each fragmented block through a kinetic energy theorem based on the energy of each fragmented block, and multiplying the movement velocity with the trajectory unit vector to obtain a trajectory vector of the fragmented blocks.

The present invention at least has the following beneficial effects:

According to the three-dimensional simulation and prediction method for a rock collapse movement process considering a dynamic fragmentation effect provided by the present invention, by constructing a fragmented block volume model, a fragmented block trajectory model, and a fragmented block energy distribution model, a three-dimensional simulation of a process that a rock mass collides with a slope surface to produce fragmentation can be implemented; and by predicting a volume, energy, and a movement direction of rock blocks after fragmentation, the accuracy and reliability of fine and quantitative risk estimation for rock collapse disasters can be improved.

Hereinafter, the present invention will be further described through specific embodiments with reference to the accompanying drawings.

DETAILED DESCRIPTION OF THE EMBODIMENTS

The technical solutions in the embodiments of the present invention are clearly and completely described below with reference to the accompanying drawings in the embodiments of the present invention. Apparently, the described embodiments are merely some rather than all of the embodiments of the present invention.

In the description of the present invention, it should be understood that the orientations or positional relationships indicated by the terms "upper", "lower", "front", "rear", "left", "right", "top", "bottom", "inner", "outer", and the like are in accordance with those shown in the accompanying drawings, and are intended only for the convenience of describing the present invention and simplifying the description rather than for indicating or implying that the referred devices or elements must be provided with a particular orientation or constructed or operated in a particular orientation; and therefore, these terms should not be construed as limiting the present invention.

Figure 1:
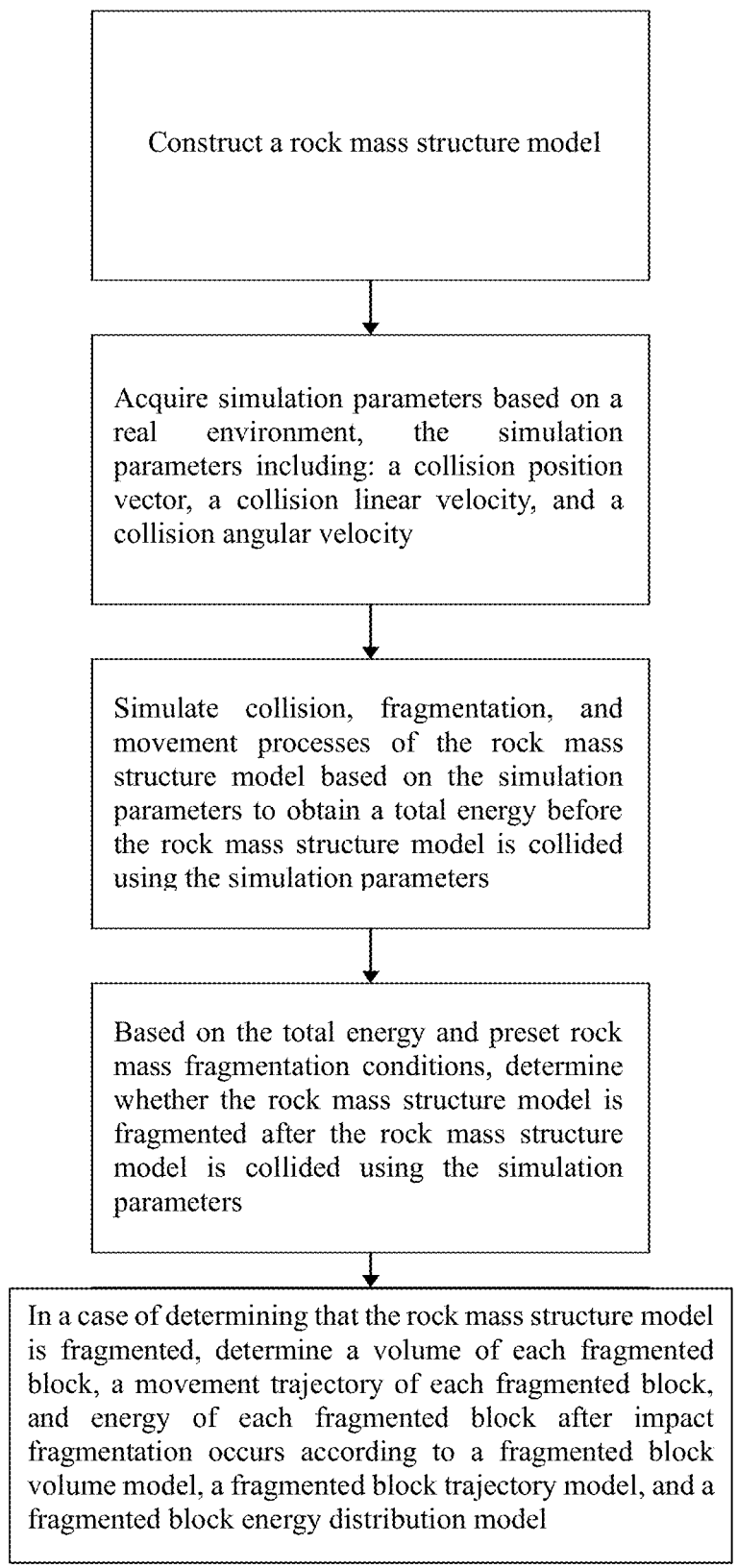
FIG. 1 is a flow diagram of a three-dimensional simulation and prediction method for a rock collapse movement process considering a dynamic fragmentation effect provided by embodiments of the present invention.
Figure 2:
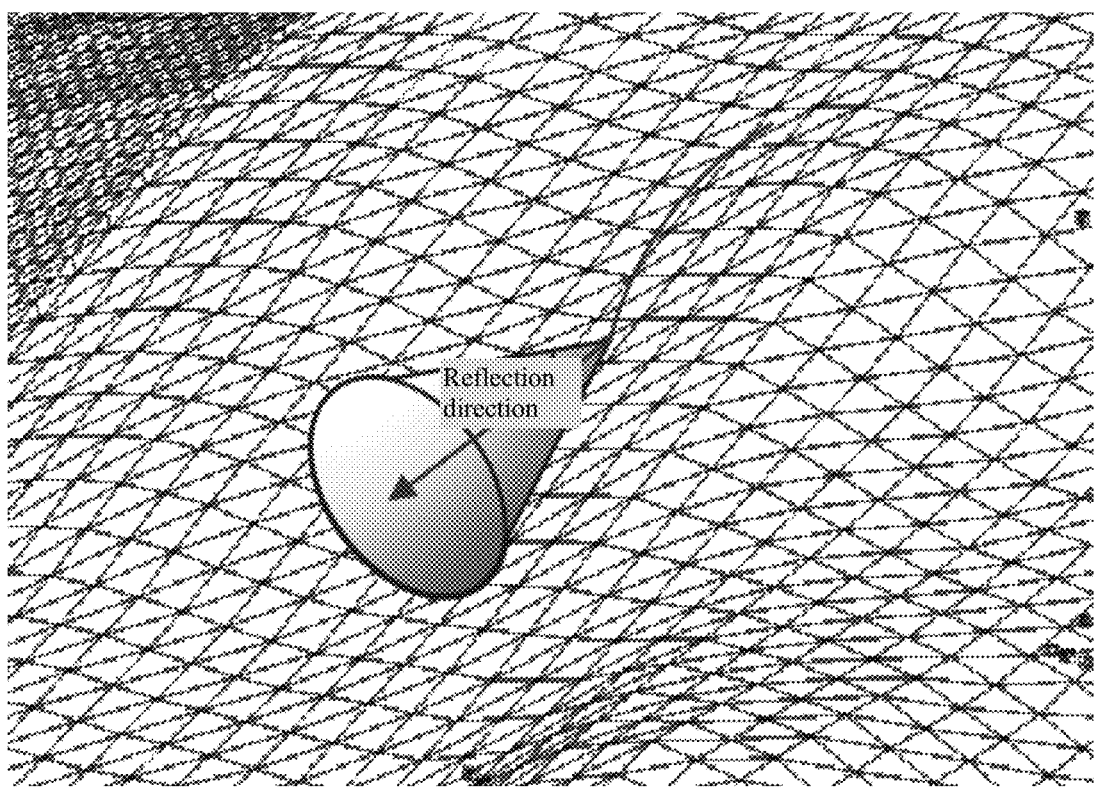
FIG. 2 is a schematic diagram of a comparative simulation effect of a rock collapse disaster prototype case according to the embodiments of the present invention.

Referring to FIG. 1 to FIG. 2, the present invention provides a three-dimensional simulation and prediction method for a rock collapse movement process considering a dynamic fragmentation effect. The method includes:

constructing a rock mass structure model;

acquiring simulation parameters based on a real environment, the simulation parameters including: a collision position vector $\vec{p} = (P_x, P_y, P_z)$, a collision linear velocity $\vec{v} = (V_x, V_y, V_z)$, and a collision angular velocity simulating collision, fragmentation, and movement processes of the rock mass structure model based on the simulation parameters to obtain a total energy before the rock mass structure model is collided using the simulation parameters;

based on the total energy and preset rock mass fragmentation conditions, determining whether the rock mass structure model is fragmented after the rock mass structure model is collided using the simulation parameters;

in a case of determining that the rock mass structure model is fragmented, determining a volume of each fragmented block, a movement trajectory of each fragmented block, and energy of each fragmented block after impact fragmentation occurs according to a fragmented block volume model, a fragmented block trajectory model, and a fragmented block energy distribution model.

A collision-fragmentation-movement process of rock collapse is simulated by acquiring parameters of a real environment. When a rock mass impacts a slope surface, preset rock mass fragmentation conditions are used to determine whether the rock mass structure model is fragmented, and if the preset rock mass fragmentation conditions are not met, rock blocks enter a conventional stage of bouncing, sliding, and rolling. If the preset rock mass fragmentation conditions are met, a volume of each fragmented block, a movement trajectory of each fragmented block, and energy of each fragmented block after impact fragmentation occurs are determined according to a fragmented block volume model, a fragmented block trajectory model, and a fragmented block energy distribution model, so as to implement a three-dimensional simulation of a process that the rock mass collides with the slope surface to produce fragmentation. Moreover, by predicting a volume, energy, and a movement direction of the rock blocks after fragmentation, the accuracy and reliability of fine and quantitative risk estimation for rock collapse disasters can be improved.

The based on the total energy and preset rock mass fragmentation conditions, determining whether the rock mass structure model is fragmented after the rock mass structure model is collided using the simulation parameters includes:

generating a random number; and determining whether the rock mass structure model is fragmented based on a comparison between the total energy and a preset rock mass fragmentation energy threshold, as well as a comparison between the random number and a preset rock block fragmentation survival rate.

By setting the rock mass fragmentation conditions, whether the rock mass structure will be fragmented due to the rock mass impact can be determined, so that the fine and quantitative risk estimation for rock collapse disasters can be more accurate and reliable.

Only when the total energy before the rock mass collides with the slope surface is greater than the preset rock mass fragmentation energy threshold, the rock mass structure model will be fragmented, and otherwise, the rock mass structure model will not be fragmented. The set rock mass fragmentation survival rate indicates that when the total energy before the rock mass collides with the slope surface is greater than the preset rock mass fragmentation energy threshold, the rock mass structure model will not be fragmented; only when a preset rock block fragmentation survival rate is greater than the generated random number, the rock mass structure model will be fragmented, and the numerical ranges of the preset rock mass fragmentation energy threshold and the generated random number are both within [0, 1]. That is, only when the total energy before the rock mass collides with the slope surface is greater than the preset rock mass fragmentation energy threshold and the preset rock block fragmentation survival rate is greater than the generated random number, the rock mass structure model will be fragmented, and otherwise, the rock mass structure model will not be fragmented.

The determining a volume of each fragmented block after impact fragmentation occurs according to a fragmented block volume model includes:

acquiring a volume $V_0$ of an initial rock block and a relative cumulative quantity P of the fragmented blocks;

determining a volume V of a rock block in an accumulation area based on a preset volume control formula, where the volume control formula is $P=c*V^{-b}$, and c and b in the formula are power-law distribution parameters.

One of the dynamic fragmentation characteristics of rock collapse is the production of smaller fragmented blocks after collision. The number of initial blocks with a volume of 1-2 m³ may be reduced by 6-9 orders of magnitude, and for the rock collapse exceeding 20,000 m³, the number of the initial blocks may be reduced by 15-18 orders of magnitude. The collision of rock masses follows the power-law distribution rules of the relative cumulative number P and the volume of the fragmented blocks. Accordingly, a volume control equation $P=c*V^{-b}$ for the fragmented blocks generated by fragmentation of the rock mass structure model is constructed.

The volume of each fragmented block after impact fragmentation occurs is determined according to the following formula:

$$\begin{cases} V = \left(\dfrac{c}{R_i}\right)^{\frac{1}{b}}, \\ \sum_n V_i = V_0 \end{cases}$$

where $R_i$ is a random number of a volume of random fragmented blocks generated by an ith collision, $V_i$ is a volume of fragmented blocks generated by an ith collision, and n is a quantity of the fragmented blocks.

When the rock mass structure model is fragmented, the volumes of the fragmented blocks will be randomly generated in a form of power-law distribution until a sum of the volumes of the fragmented blocks is equal to the volume $V_0$ of the initial block. The volumes of the fragmented blocks follow the volume conservation criterion of the fragmented blocks. An inverse power-law equation $$V = \left(\dfrac{c}{R_i}\right)^{\frac{1}{b}}$$

of the volume $V_0$ of the initial block is used to determine the volume of each fragmented block after impact fragmentation occurs, where the inverse power-law equation satisfies an iteration condition $\Sigma_n V_i = V_0$.

The determining energy of each fragmented block after impact fragmentation occurs according to a fragmented block energy distribution model includes:

determining a sum of energy of each fragmented block according to a formula $E_k^b = E_k^a + E_d + E_b$, where in the formula: $E_k^b$ is total energy before collision, $E_d$ is energy lost during collision, $E_b$ is energy dissipated by fragmentation, $E_k^a$ is the sum of the energy of each fragmented block;

determining the energy of each fragmented block according to a formula $$\dfrac{V_i}{V_0} = \dfrac{E}{E_k^b},$$

where in the formula, E is the energy of each fragmented block.

An energy conversion relationship in the process that the rock mass collides with the slope surface to produce fragmentation is $E_k^b = E_k^a + E_d + E_b$. After the rock mass structure model is fragmented, the sum $E_k^a$ of the energy of each fragmented block is obtained by subtracting the energy $E_b$ dissipated by fragmentation and the energy $E_d$ lost during collision from the total energy $E_k^b$ before collision. The kinetic energy produced after rock mass collision is transmitted to each fragmented block according to the volumes of the fragmented blocks. The ratio of the volume of the fragmented blocks to the volume of the initial block is equal to the ratio of the energy of the fragmented blocks to the sum of the energy of each fragmented block, that is, the larger the volume of the fragmented block, the greater the energy distributed thereto.

The determining a movement trajectory of each fragmented block after impact fragmentation occurs according to a fragmented block trajectory model includes:

determining an impact point of a rock block based on simulation parameters;

establishing a cone equation based on the impact point, determining a random vector of the rock block inside a cone through a rectangular coordinate-spherical coordinate transformation method, and unitizing the random vector to determine a trajectory unit vector of the rock block after collision; and determining a movement velocity of each fragmented block through a kinetic energy theorem based on the energy of each fragmented block, and multiplying the movement velocity with the trajectory unit vector to obtain a trajectory vector of the fragmented blocks.

As shown in FIG. 2, after colliding with the slope surface, the rock block will be fragmented to form blocks with independent trajectories. The trajectories of the fragmented blocks will be distributed within a cone with the impact point as the vertex. A cone equation is introduced to establish a movement trajectory model after fragmentation of the rock mass structure model. A random vector of the rock block inside the cone is obtained by adopting a rectangular coordinate-spherical coordinate transformation method; the random vector is unitized to determine a trajectory direction of the rock block after collision; and then, a movement velocity of each fragmented block is determined through a kinetic energy theorem based on the energy of each fragmented block; and the movement velocity is multiplied with the trajectory unit vector to obtain a trajectory vector of the fragmented blocks, that is, a movement trajectory of the fragmented blocks.

Those skilled in the art will understand that the embodiments of the present application may be provided as a method, a virtual system, or a computer program product. Therefore, the present application may be in the form of a hardware only embodiment, a software only embodiment, or an embodiment with a combination of software and hardware. Moreover, the present application may be in the form of a computer program product that is implemented on one or more computer-usable storage media (including but not limited to a disk memory, a CD-ROM, an optical memory, and the like) that include computer-usable program code.

The corresponding virtual apparatus may include an application program and an operating system, where the application program executes a method of operation described above. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams. These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

It may also be a memory that is an example of a computer readable medium. The computer readable medium includes permanent and non-permanent, removable and non-removable media, and can store information using any method or technology. The information may be computer readable instructions, data structures, modules of programs, or other data. Examples of computer storage media include, but are not limited to, a phase change memory (PRAM), a static random access memory (SRAM), a dynamic random access memory (DRAM), other types of random access memories (RAM), a read-only memory (ROM), an electrically erasable programmable read-only memory (EEPROM), a flash memory or other memory technologies, a compact disc read-only memory (CD-ROM), a digital versatile disc (DVD) or other optical storage, a magnetic cassette tape, magnetic tape-magnetic disk storage, or other magnetic storage devices, or any other non-transmission medium that can be configured to store information accessible by computing devices. As defined herein, the computer readable medium does not include transitory computer readable media (transitory media), such as modulated data signals and carriers.

Moreover, the terms "comprise", "include" or any other variations thereof intend to cover non-exclusive inclusion, so that the procedure, method, commodity, or means including a series of elements not only include those elements, but also include other elements that are not specifically listed, or also include inherent elements of this procedure, method, commodity, or means. An element preceded by "includes a . . . " does not, without more constraints, preclude the existence of additional identical elements in the process, method, commodity, or device that includes the element. The terms "first", "second", etc. are used to denote names and do not denote any particular order. The above schematically describes the present invention-creation and implementations thereof without limitation. The present invention can be implemented in other specific forms without departing from the spirit or essential features thereof. The structure shown in the accompanying drawings is only one of the embodiments of the present invention-creation, the actual structure is not limited thereto, and any reference numerals in the claims shall not limit the claims involved. Therefore, if a person of ordinary skill in the art is inspired thereby to devise structure modes and embodiments similar to the technical solution of the present invention without departing from the spirit of the present creation and without making creative efforts, such structure modes and embodiments shall all fall within the protection scope of the present patent.

What is claimed is:

1. A three-dimensional simulation and prediction method for a rock collapse movement process considering a dynamic fragmentation effect, wherein the method is performed by a simulating and predicting system comprising a processor and a sensor, the sensor is configured for acquiring simulation parameters based on a real environment, the simulation parameters comprising: a collision position vector $\vec{p}=(P_x, P_y, P_z)$ a collision linear velocity $\vec{v}=(V_x, V_y, V_z)$, and a collision angular velocity $\vec{\omega}=(\omega_x, \omega_y, \omega_z)$; and the processor is configured for:
constructing a rock mass structure model;
simulating collision, fragmentation, and movement processes of the rock mass structure model based on the simulation parameters to obtain a total energy before the rock mass structure model is collided using the simulation parameters;

based on the total energy and preset rock mass fragmentation conditions, determining whether the rock mass structure model is fragmented after the rock mass structure model is collided using the simulation parameters;

in a case of determining that the rock mass structure model is fragmented, determining a volume of each fragmented block, a movement trajectory of each fragmented block, and energy of each fragmented block after impact fragmentation occurs according to a fragmented block volume model, a fragmented block trajectory model, and a fragmented block energy distribution model; wherein the determining a volume of each fragmented block after impact fragmentation occurs according to a fragmented block volume model comprises:

acquiring a volume $V_0$ of an initial rock block and a relative cumulative quantity P of the fragmented blocks;

determining a volume V of a rock block in an accumulation area based on a preset volume control formula, wherein the volume control formula is $P=c*V^{-b}$, and c and b in the formula are power-law distribution parameters;

determining the volume of each fragmented block after impact fragmentation occurs according to the following formula:

$$\begin{cases} V = \left(\dfrac{c}{R_i}\right)^{\frac{1}{b}}, \\ \sum_n V_i = V_0 \end{cases}$$

wherein $R_i$ is a random number of a volume of random fragmented blocks generated by an ith collision, $V_i$ is a volume of fragmented blocks generated by an ith collision, and a quantity of the fragmented blocks is n;

the determining energy of each fragmented block after impact fragmentation occurs according to a fragmented block energy distribution model comprises:

determining a sum of energy of each fragmented block according to a formula $E_k^b = E_k^a + E_d + E_b$, wherein in the formula: $E_k^b$ is total energy before collision, $E_d$ is energy lost during collision, $E_b$ is energy dissipated by fragmentation, $E_k^a$ is the sum of the energy of each fragmented block;

determining the energy of each fragmented block according to a formula $$\frac{V_i}{V_0} = \frac{E}{E_k^b},$$

wherein in the formula, E is the energy of each fragmented block;

the determining a movement trajectory of each fragmented block after impact fragmentation occurs according to a fragmented block trajectory model comprises:

determining an impact point of a rock block based on simulation parameters;

establishing a cone equation based on the impact point, determining a random vector of the rock block inside a cone through a rectangular coordinate-spherical coordinate transformation method, and unitizing the random vector to determine a trajectory unit vector of the rock block after collision; and determining a movement velocity of each fragmented block through a kinetic energy theorem based on the energy of each fragmented block, and multiplying the movement velocity with the trajectory unit vector to obtain a trajectory vector of the fragmented blocks.

2. The three-dimensional simulation and prediction method for a rock collapse movement process considering a dynamic fragmentation effect according to claim 1, wherein the based on the total energy and preset rock mass fragmentation conditions, determining whether the rock mass structure model is fragmented after the rock mass structure model is collided using the simulation parameters comprises:

generating a random number; and determining whether the rock mass structure model is fragmented based on a comparison between the total energy and a preset rock mass fragmentation energy threshold, as well as a comparison between the random number and a preset rock block fragmentation survival rate.

* * * * *